United States Patent
Gilmer et al.

[19]

[11] Patent Number: 6,106,618
[45] Date of Patent: Aug. 22, 2000

[54] PHOTORESIST APPLICATION FOR A CIRCLET WAFER

[75] Inventors: Mark C. Gilmer, Austin; Mark I. Gardner, Cedar Creek, both of Tex.

[73] Assignee: Advanced Micro Devices, Inc., Sunnyvale, Calif.

[21] Appl. No.: 09/088,783

[22] Filed: Jun. 1, 1998

[51] Int. Cl.[7] .................... B05C 11/02; B05C 13/00; B05C 9/06; B05B 3/02
[52] U.S. Cl. ................. 118/52; 118/56; 118/316; 118/315; 118/313; 118/319; 118/320; 118/321; 118/323
[58] Field of Search ...................... 118/319, 320, 118/52, 56, 316, 503, 500, 315, 313, 728, 729, 730; 269/50; 82/168; 427/208, 425, 209; 29/25.01

[56] References Cited

U.S. PATENT DOCUMENTS 5,393,349  2/1995  Ohkase ........................... 118/725
5,626,913  5/1997  Tomoeda et al. .................. 427/299

OTHER PUBLICATIONS

Stanley Wolf and Richard N. Tauber, *Silicon Processing for the VLSI Era, Volume 1–Process Technology;* pp. 407–409, and 429–437; 1986.

*Primary Examiner*—Laura Edwards
*Assistant Examiner*—George R. Koch, III
*Attorney, Agent, or Firm*—Timothy M. Honeycutt

[57] ABSTRACT

Apparatus and method for depositing fluids on both sides of a semiconductor wafer that has a central opening are provided. In one aspect, the apparatus includes a mandrel for holding the wafer and a motor coupled to the mandrel and that is operable to rotate the mandrel. The apparatus also includes means for dispensing a first volume of fluid on the semiconductor wafer and a second volume of fluid on the semiconductor wafer. According to the method, a semiconductor wafer is coupled to a rotatable mandrel. The mandrel is rotated to spin the semiconductor wafer and a semiconductor processing fluid is sprayed on the first and second sides of the semiconductor wafer.

42 Claims, 8 Drawing Sheets

PHOTORESIST APPLICATION FOR A CIRCLET WAFER

BACKGROUND OF THE INVENTION

1. Field of the Invention

This invention relates generally to semiconductor processing, and more particularly to method and apparatus for depositing semiconductor processing fluids on one or both sides of a semiconductor wafer.

2. Description of the Related Art

The fabrication of modern integrated circuits requires the patterning of millions of different types of regions on a semiconductor wafer, such as local interconnect trenches, global metallization layers, and transistor gates, to name just a few. The manufacturer of such multitudes of tiny structures is made possible by the use of lithographic processing. In photolithographic processing, various layers of photoresist materials are spin-coated onto the wafer. Next, the photoresist layer(s) is exposed to an actinic radiation source, normally ultraviolet. The UV radiation is first passed through a mask or reticle that selectively passes some of the UV radiation while blocking other portions so that only preselected portions of the photoresist are exposed to the radiation. The radiation changes the chemical character of the photoresist, either rendering it soluble or insoluble in a subsequent solvent step, depending upon whether the resist is negative photoresist or positive photoresist. The resist is then developed by exposure to a developer solvent. The areas of the photoresist remaining after the development step protect the substrate regions which they cover.

In conventional processing, the wafer is typically pre-baked and coated with a photoresist primer that promotes the adhesion of the photoresist to the underlying substrate material. The pre-baked step is carried out to remove water from the substrate that might otherwise interfere with the adhesion of the photoresist to the substrate. The primer is commonly applied by spin coating or vapor deposition. Hexamethyldisilazane ("HMDS") is an example of a photoresist primer, and is widely used in photoresist processing.

Following the cleaning, pre-bake, and primer steps, the wafer is coated with photoresist. Spin coating is a process frequently employed to apply photoresist to a substrate. In conventional processing, the spin coating procedure involves three stages: a) dispensing the resist solution onto the wafer; b) accelerating the wafer to a final rotational speed; and c) spinning at a constant speed to establish the desired thickness and to dry the film. The dispensing stage is accomplished by flooding the entire wafer with resist solution before commencing the spin cycle, or by dispensing a smaller volume of resist solution at the center of the wafer and spinning at relatively low speeds to produce a uniform liquid layer across the wafer. In some conventional processes, the wafer is held stationary while the resist is dispensed. In the acceleration stage, the wafer is quickly ramped up to the desired spin speed. High ramping rates generally yield better film uniformities than lower ramping rates. The constant speed spin cycle establishes a relatively uniform profile for the photoresist across the wafer and evaporates the remaining solvent to produce a solid film of photoresist.

There are several disadvantages associated with conventional photoresist deposition processing. Conventional apparatus for dispensing photoresist on a wafer require the wafer to be disposed in a horizontal or flat orientation. As a result, such systems are prone to unwanted dripping of photoresist onto the wafer from the dispensing nozzle which can lead to defects in the photoresist. To compensate for this problem, many conventional photoresist dispensing pumps now incorporate a suck-back action, which draws back excess photoresist from the dispensing nozzle into the supply line. The suck-back feature has not eliminated all dripping problems and has introduced design complexities associated with air bubbles becoming entrapped in the photoresist supply line which can lead to air bubbles becoming entrapped in the photoresist and causing defects. In addition, the horizontal orientation of wafers in conventional photoresist dispensing machines can lead to a phenomenon known as dishing. In dispensing machines where the wafer is secured to a spinning chuck by vacuum, excess vacuum force applied near the center of the wafer may cause the wafer to deform slightly and take on a dish-like profile. As a result, resist can puddle at the center of the wafer. Finally, for relatively large wafers, e.g., above 450 mm. in diameter, surface tension effects may lead to undesirable variations in the thickness of the photoresist film, particularly at the outer edges of the wafer.

Another disadvantage associated with conventional photoresist processing machines is the inability to efficiently coat both sides of a dual sided wafer. Conventional machines are configured to deposit photoresist on one side of a given wafer at a time. If coating of both sides of a dual sided wafer is contemplated, one side of the wafer must first be coated in the machine, and then the wafer must be lifted out of the spin bowl, flipped and repositioned in the spin bowl, and a second and separate coating step must be performed. This may be a time consuming operation and requires very delicate handling of the wafer to avoid damaging the coated side while photoresist is applied to the uncoated side.

The present invention is directed to overcoming or reducing the effects of one or more of the foregoing disadvantages.

SUMMARY OF THE INVENTION

In accordance with one aspect of the present invention, an apparatus for depositing fluids on a semiconductor wafer that has first and second sides and a central opening is provided. The apparatus includes a mandrel for holding the wafer and a motor coupled to the mandrel that is operable to rotate the mandrel. A first container is provided for holding a first volume of fluid. The first container has a first orifice for dispensing the first volume of fluid on the first side of the wafer. A second container is provided for holding a second volume of fluid and has a second orifice for dispensing the second volume of fluid on the second side of the wafer.

In accordance with another aspect of the present invention, an apparatus for depositing fluids on a semiconductor wafer that has first and second sides and a central opening is provided. The apparatus includes a mandrel for holding the wafer and a motor coupled to the mandrel that is operable to rotate the mandrel. The apparatus also includes means for dispensing a first volume of fluid on the semiconductor wafer and a second volume of fluid on the semiconductor wafer.

In accordance with another aspect of the present invention, an apparatus for depositing fluids on a semiconductor wafer that has first and second sides and a central opening is provided. The apparatus includes a mandrel for holding the wafer and a motor coupled to the mandrel that is operable to rotate the mandrel. A first container is provided that has a first chamber for holding a first volume of fluid and a first orifice for dispensing the first volume of fluid on the first side of the wafer. The container also includes a second chamber for holding a second volume of fluid and a second orifice for dispensing the second volume of fluid on the first side of the wafer. A second container is provided that has a third chamber for holding a third volume of fluid and a third orifice for dispensing the third volume of fluid on the second side of the wafer. The second container also includes a fourth chamber for holding a fourth volume of fluid and a fourth orifice for dispensing the fourth volume of fluid on the second side of the wafer.

In accordance with another aspect of the present invention, a method of depositing a first fluid on a semiconductor wafer that has first and second sides is provided. The method includes the steps of coupling the wafer to a rotatable mandrel, rotating the mandrel to spin the wafer, and spraying the fluid on the first and second sides of the semiconductor wafer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
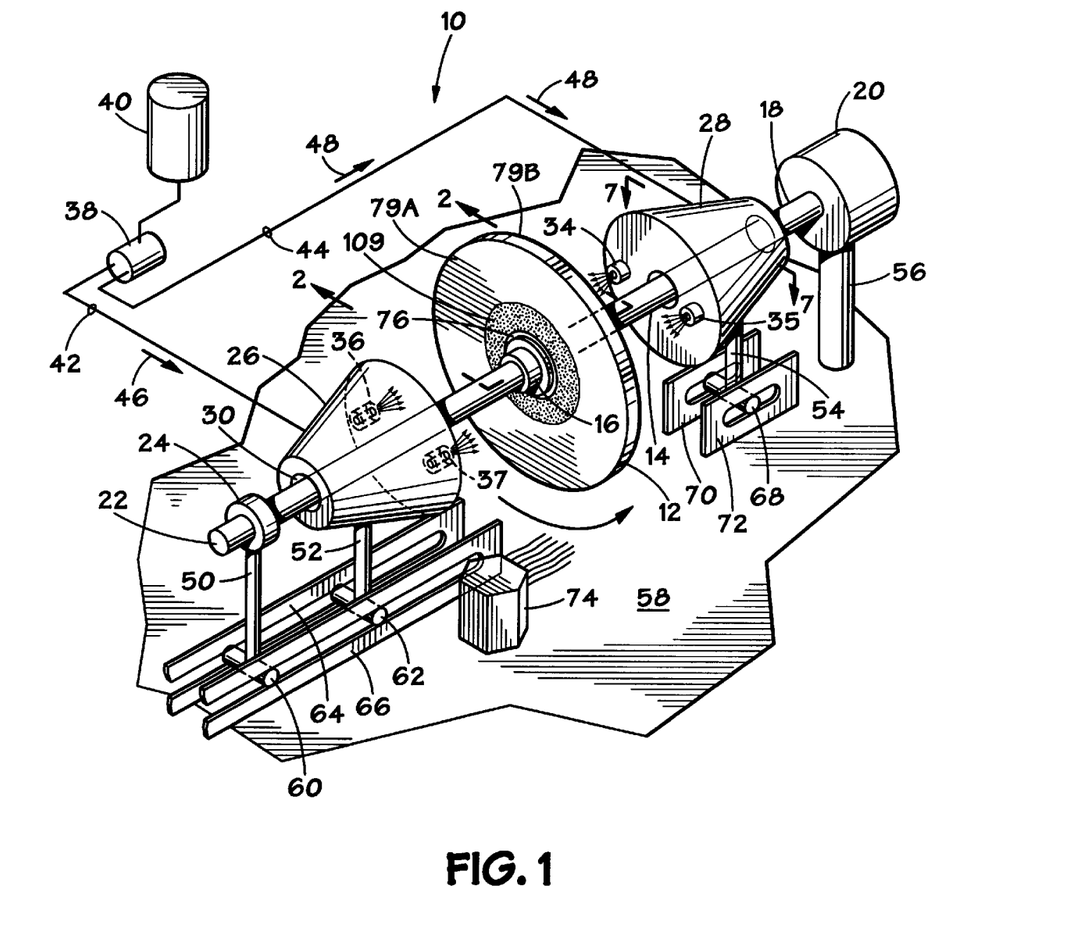
FIG. 1 is a pictorial view of an exemplary embodiment of an apparatus for dispensing fluid on a semiconductor wafer in accordance with the present invention.

In the drawings described below, reference numerals are generally repeated where identical elements appear in more than one figure. Turning now to the drawings, and in particular to FIG. 1, there is shown an exemplary embodiment of an apparatus 10 for depositing a semiconductor processing fluid on a semiconductor wafer 12 in accordance with the present invention. The wafer 12 may be silicon, silicon-on-insulator, or other suitable semiconductor wafer materials. The fluid may be any of a variety of fluids used to process semiconductor wafers, such as cleaning solvents, photoresist primers, photoresists, or others.

The wafer 12 is secured to a mandrel 14 by a coupling 16. One end 18 of the mandrel 14 is coupled to a motor 20. The other end 22 of the mandrel 14 is rotatably secured to a bearing 24. The coupling of the end 18 to the motor 20 is depicted schematically as a direct coupling. However, the skilled artisan will appreciate that torque may be transmitted to the mandrel through a step-up or reduction gearing assembly, via a belt and pulley arrangement, or other drive linkages.

The motor 20 is designed to selectively rotate the mandrel 14 through a range of speeds suitable for spin coating the wafer 12. The speed range may extend to rates of 10,000 rpm. The ability to quickly ramp up the rotational speed during the spin cycle is advantageous. The motor 20 may be powered by AC or DC current. If the motor 20 is not otherwise isolated from the fluids dispensed on the wafer, the enclosure of the motor 20 should be designed to isolate the internal structure of the motor 20 from those ambient materials.

The mandrel 14 is designed to spin the wafer 12 at rates of 10,000 rpm or greater. The mandrel 14 is advantageously composed of a material of sufficient stiffness to produce very little deflection throughout the anticipated speed range, and that is resistant to chemical attack by the various semiconductor processing fluids dispensed on the wafer 12. Corrosion resistance is desirable to avoid contaminating the wafer 12 with corrosion particulates that might fling off of the exterior of the mandrel 14 during high speed rotation. Exemplary materials include stainless steel, inconel, MP35N alloy, or like materials.

First and second containers 26 and 28 are disposed on opposite sides of the wafer 12. The container 26 has a centrally disposed bore 30 through which the mandrel 14 is inserted or journalled. The container 28 has an identical bore 32. The container 28 is provided with an orifice or nozzle 34 and may be provided with a companion orifice 35 as shown. The orifices 24 and 35 are designed to spray the semiconductor processing fluid onto the wafer 12. The container 26 is provided with an identical pair of orifices 36 and 37, which are shown in phantom in FIG. 1. The containers 26 and 28 are supplied with the semiconductor processing fluid by a pump 38 which draws the fluid from a main reservoir 40 and delivers the fluid to the containers 26 and 28 via respective supply lines 42 and 44. The flow direction for the supply lines 42 and 44 are indicated by the respective arrows 46 and 48.

The bearing 24, the dispensers 26 and 28, and the motor 20 are all supported by structure depicted schematically as the support pegs 50, 52, 54, and 56 all projecting upward from a common base 58. The pegs 50 and 52 are mounted on rollers 60 and 62 disposed in slotted rails 64 and 66 so that the bearing 24 and the container 26 may be moved longitudinally with respect to the wafer 12. It is necessary to move the bearing 24 and the container 26 off of the mandrel 14 so that the wafer 12 can be slipped over the mandrel 14 and secured by the coupling 16. The bearing 24 and the container 26 may then be slipped back over the mandrel 14 and moved longitudinally proximate the wafer 12. A similar combination of a roller 68 and a pair of slotted rails 70 and 72 are provided for the container 28. The pegs 50, 52, 54, and 56, as well as the base 58 are intended to be illustrative only as the apparatus 10 will generally be surrounded by an enclosure to reduce the possibility of contamination as well as splattering of the semiconductor processing fluid. The configuration of the enclosure is largely a matter of design discretion. A heating element 60 is provided to enable in situ heating of the wafer 12 both before and after deposition of the semiconductor processing fluid.

Figure 2:
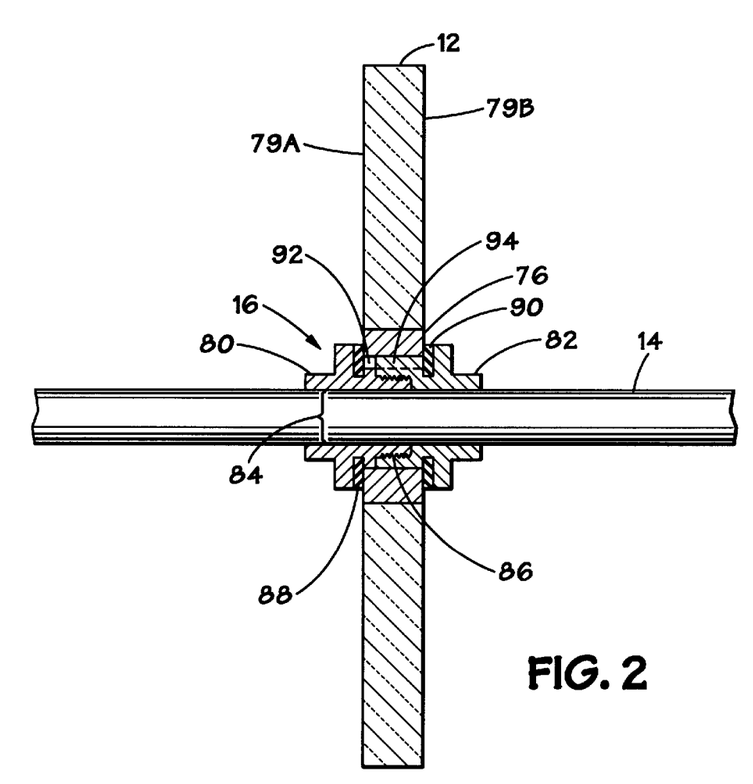
FIG. 2 is a cross-sectional view of FIG. 1 taken at section 2—2.

The detailed structure of the connection between the coupling 16, the wafer 12, and the mandrel 14 may be understood by referring now also to FIG. 2, which is a cross-sectional view of FIG. 1 taken at section 2—2. The wafer 12 is depicted as a circlet wafer that has an inner ring 76 provided with a central opening 78 through which the mandrel 14 is journalled. The inner ring 76 is designed to permit the wafer 12 to be handled during transport and other processing without risk of damaging the otherwise delicate first and second sides 79A and 79B thereof. Accordingly, the ring 76 is advantageously composed of a hard chemically inert material, such as a ceramic, diamond, silicon carbide, or like materials.

The coupling 16 is composed of two mating halves 80 and 82 which share a common bore 84 through which the mandrel 14 is journalled. The halves 80 and 82 are threadedly engaged at 86. The half 82 is advantageously secured to the mandrel 14 so that it will rotate along with the mandrel 14. This may be accomplished by providing a interference fit between the half 82 and the mandrel 14, by welding, or by other suitable fastening techniques. The half 80 is provided with a relatively loose fit about the mandrel 14 so that the wafer 12 may be loaded onto the mandrel 14 by sliding the half 80 off of the mandrel, sliding the wafer 12 onto the mandrel and abutting it against the half 82 and again sliding the half 80 onto the mandrel and screwing it into the half 82. The halves 80 and 82 are advantageously composed of the same materials used to fabricate the mandrel 14.

The halves 80 and 82 are provided with respective elastomeric members 88 and 90. The elastomeric members 88 and 90 provide a relatively soft and compliant interface between the halves 80 and 82 and the inner ring 76. A soft and compliant cushion between the halves 80 and 82 and the inner ring 76 is desirable from both alignment and surface protection standpoints. Variations in the thickness of the inner ring 76 that might otherwise cause the wafer to be misaligned vertically when engaged by the coupling 16 will be compensated by the elastomeric character of the elastomeric members 88 and 90. Similarly, the surfaces of the inner ring 76, and particularly the wafer 12 are protected from scratching or other damage by the halves 80 and 82. This protection is important where the ring 76 is fabricated with an irregular diameter so that the halves 80 and 82 actually come into contact with the surfaces 79A and 79B of the wafer 12. The elastomeric members 88 and 90 are advantageously composed of a suitable elastomeric material that is resistant to chemical attacked by the semiconductor processing fluids anticipated. Exemplary materials include natural rubber nitrile rubber, polyurethane, or like materials.

Figure 3:
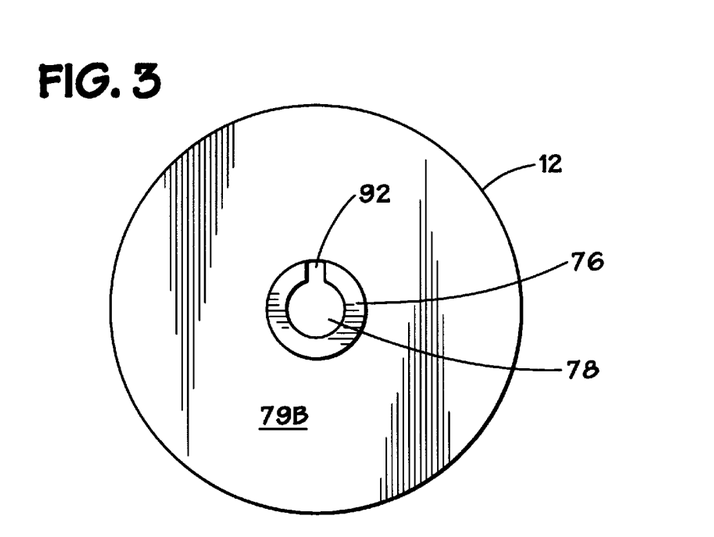
FIG. 3 is an end view of the wafer shown in FIGS. 1 and 2.

The engagement of the halves 80 and 82 clamps the wafer 12 into position so that rotation of the mandrel 14 will readily rotate the wafer 12. The physical engagement between the wafer 12 and the mandrel is further enhanced by the inherent tackiness of the elastomeric members 88 and 90. However, an additional physical mechanism may be incorporated to transmit torque from the mandrel 14 to the wafer 12. In this regard, as shown in FIG. 3, which is an end view of the side 79B of the wafer 12, the inner ring 76 may be provided with a longitudinal slot 92 and the half 82 may be provided with a longitudinally projecting key 94 that slides into the slot 92. In this way, torque applied to the mandrel 14 is transmitted directly to the inner ring 76 by the key 94.

Figure 4:
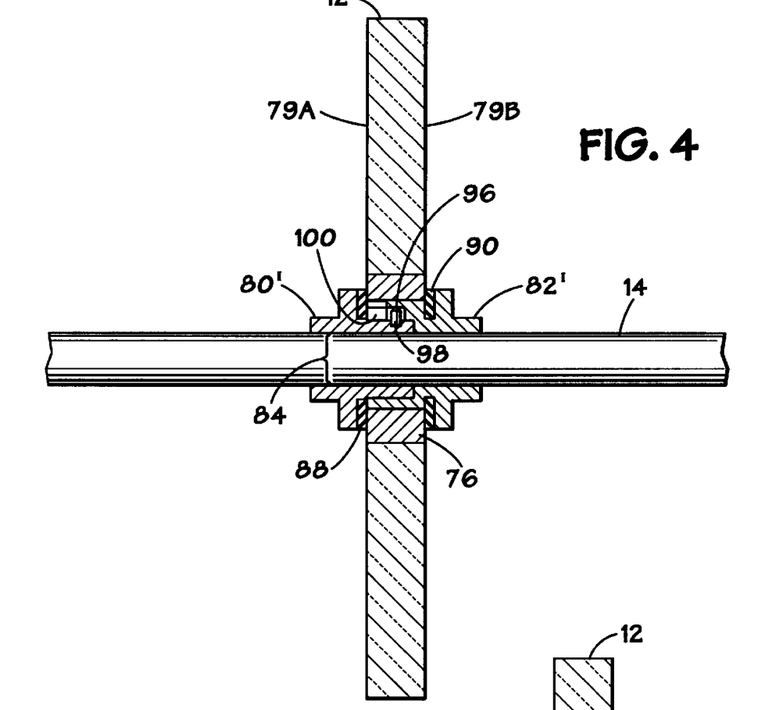
FIG. 4 is a cross-sectional view like FIG. 2 of an alternate mandrel coupling in accordance with the present invention.

In an alternate embodiment depicted in FIG. 4, the halves, now designated 80' and 82' are secured together by a quick disconnect mechanism consisting of an internal groove 96 in the half 82' and a mating pin 98 projecting radially outwardly from the half 80'. The structure is similar to a quick coupling commonly used on large outdoor sprinkler systems. The half 80' is inserted into the half 82' so that the pin 98 passes longitudinally through a longitudinal slot 100 in the half 82' until the pin 98 reaches the internal groove 96. At this point, the half 80' is rotated to engage the pin 98 within the groove 96 to firmly secure the half 80' to the half 82'.

Figure 5:
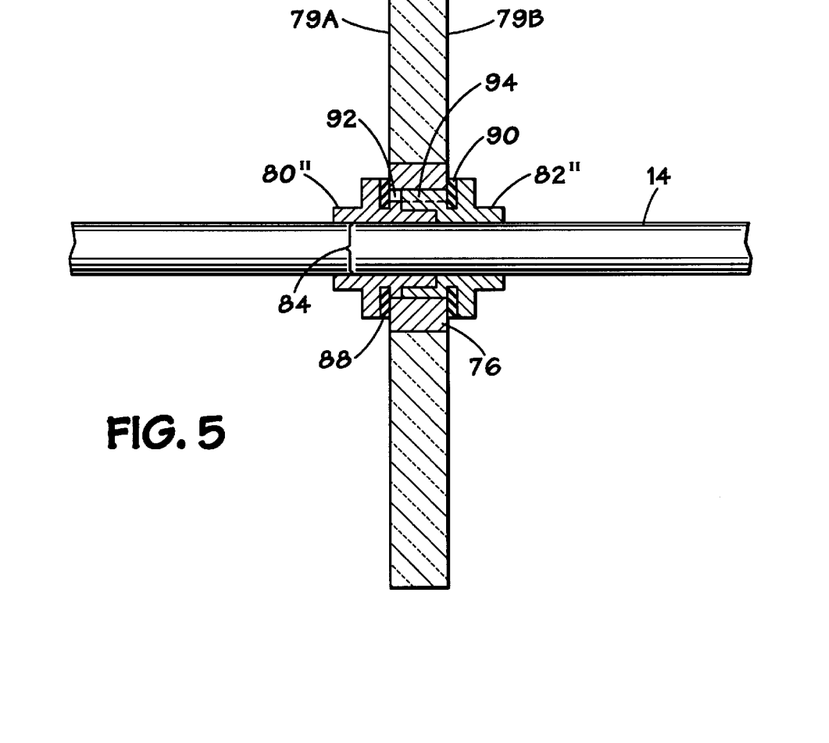
FIG. 5 is a cross-sectional view like FIG. 2 of another alternate mandrel coupling in accordance with the present invention.

In another alternate embodiment depicted in FIG. 5, the halves, now designated 80" and 82", are secured to each other by magnetism. The magnetic attraction between the halves 80" and 82" may be accomplished by fabricating both the halves 80" and 82" as permanent magnets and orienting them with their opposite poles in close proximity to provide a secure magnetic attraction there between. Alternatively, one of the halves 80" or 82" may be fabricated as a permanent magnet and the other half, 80" or 82" as the case may be, may be fabricated from a ferromagnetic material that will be strongly attracted to the permanent magnet.

Figure 6:
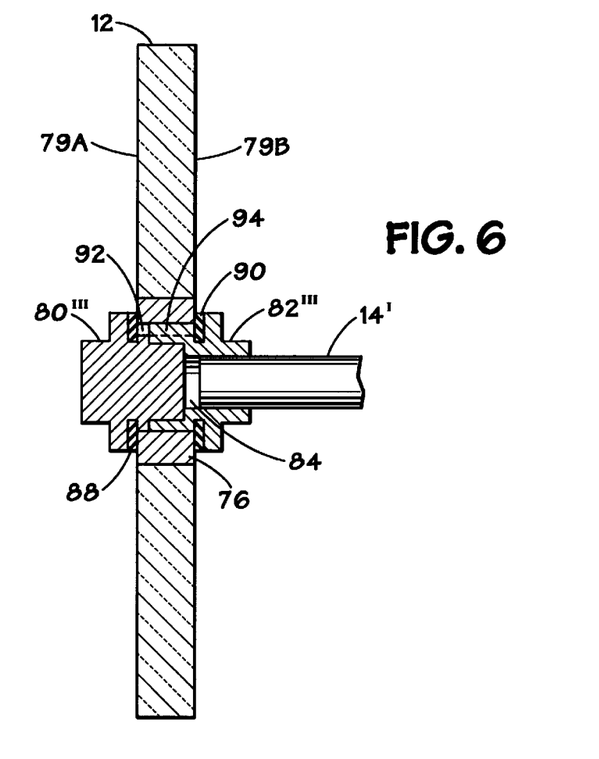
FIG. 6 is a cross-sectional view like FIG. 2 of another alternate mandrel coupling in accordance with the present invention.

FIG. 6 depicts another alternate embodiment wherein the mandrel, now designated 14' terminates in the half, now designated 82'''. The other half 80''' may be secured to the half 82''' by magnetism as shown in FIG. 6 or by any of the other aforementioned fastening techniques shown in FIGS. 3 and 4, or other suitable fastening techniques. This embodiment eliminates the requirement for journalling the mandrel 14' through both of the containers 26 and 28 depicted in FIG. 1. The requirement for the bearing 24 is also eliminated. Where the total length of the mandrel 14' is short enough in view of the anticipated revolutions/minute and the condition and configuration of the bearings in the motor 20, no further external bearings to support the mandrel 14' may be necessary.

Figure 7:
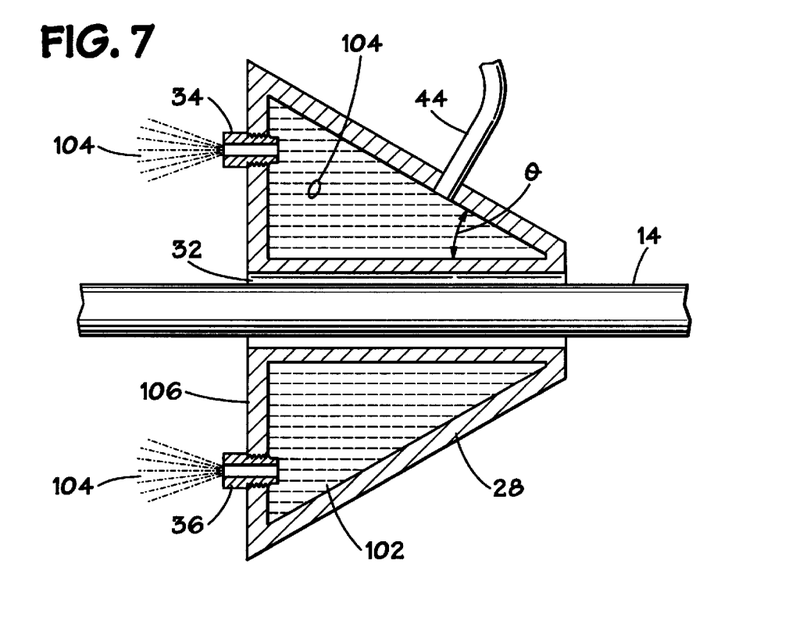
FIG. 7 is a cross-sectional view of FIG. 1 taken at section 7—7.

The detailed structure of the containers 26 and 28 shown in FIG. 1 may be understood by referring now to FIGS. 1 and 7. FIG. 7 is a cross-sectional view of FIG. 1 taken at section 7—7 and shows the structure of the container 28, which is exemplary of the structure of container 26 as well. The container 28 is configured generally as a frustro-conical member that is provided with the centrally disposed bore 32 and a frustro-conical-like internal chamber 102 to hold the semiconductor processing fluid, designated at 104 and received from the supply line 44. The larger diameter end 106 of the container 28 is projected towards the wafer 12. The orifices 34 and 35 enable the semiconductor processing fluid 104 to be sprayed onto the wafer 12 under pressure supplied from the pump 38. The number, spacing, and configuration of the orifices 34 and 35 is largely a matter of design discretion. For example, there may be only a single orifice, such as 34, or multiple such orifices. Similarly, the shape of the container 28 may be varied to suit design considerations. In an exemplary embodiment, the angle for opposing walls in the chamber 102 is advantageously about 30°.

Note that, in lieu of delivering fluid from the reservoir 40, fluid may be introduced into the containers via fill ports (not shown) and the fluid may be pumped therefrom. In either case, the skilled artisan will appreciate that it is desirable for the supply lines 42 and 44 to accommodate the longitudinal movements of the containers 26 and 28. This may be accomplished by fabricating the lines 42 and 44 out of flexible materials, such as plastics or rubbers, or by providing the lines 42 and 44 with articulated joints.

Figure 8:
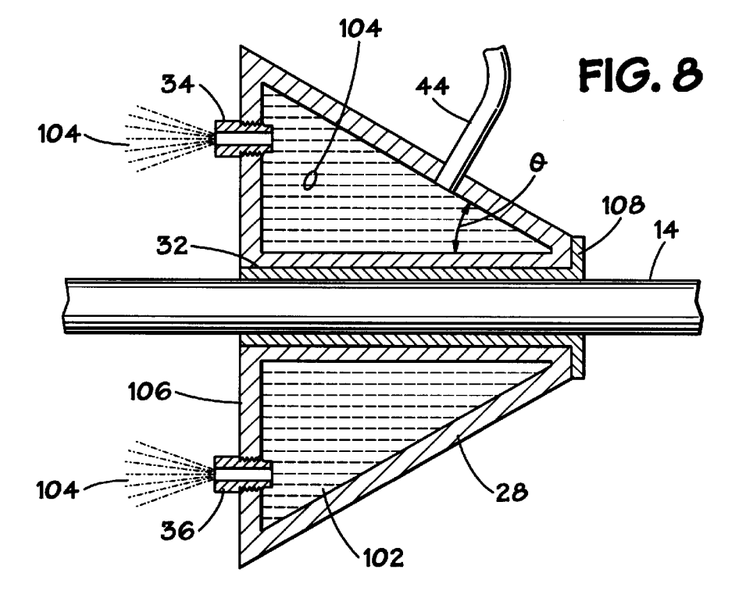
FIG. 8 is a cross-sectional view like FIG. 7 depicting an alternate dispenser container with a mandrel bushing in accordance with the present invention.

In an alternate embodiment of the container, now designated 28' and shown in FIG. 8, a bushing 108 is disposed around the mandrel 14 and in the bore 32 to provide a rotating bearing surface for the mandrel 14. This configuration may be desirable where the mandrel 14 does not project past the wafer 12, as in the embodiment depicted in FIG. 6, and where an additional rotational bearing surface is desired, or where an additional bearing surface is simply desired for design considerations. The bushing 108 may be composed of a variety of suitable materials for bushings, such as Teflon®, graphite impregnated nylon, or other suitable bushing materials.

The operation of the apparatus 10 may be understood by referring now to FIG. 1. The container 26 and the bearing 24 are moved longitudinally off of the mandrel 14 and the wafer 12 is slipped over and secured to the mandrel 14 by the coupling 16. The manner in which the coupling 16 secures the wafer 12 to the mandrel 14 will depend upon the precise configuration of the coupling. Note that a number of different variations for the coupling 16 have been described herein. After the wafer 12 is secured to the mandrel 14, the container 26 and the bearing 24 are moved longitudinally so that the mandrel 14 again journals through the bore 30 and the bearing 24 and the containers 26 and 28 are moved longitudinally into close proximity with the opposite sides 79A and 79B of the wafer 12. An initial volume of the semiconductor processing fluid is then sprayed from the containers 26 and 28 onto the wafer 12 at or near the outer edge of the ring 76. This may be accomplished while the wafer is being rotated slowly, e.g., approximately 100 rpm or less or while the wafer 12 is held stationary and then subsequently rotated at the same slow rpm. In either case the result is an annular shaped volume of fluid 109 disposed around the inner ring 76 and projecting radially outwardly some distance from the inner ring 76. A corresponding annular volume of fluid will be disposed on the side of the wafer proximate the container 28 as well. The wafer 12 may then be ramped up to a high speed for a set duration. The appropriate speed will depend on parameters, such as the desired thickness of the coating, the size of the wafer 12, among others. In an exemplary embodiment, the speed is ramped up to approximately 2000 to 3000 rpm and held at that speed for approximately 2 to 30 seconds. The spin cycle uniformly spreads the fluid 109 across both sides of the wafer 12 and ultimately dries the fluid 109. If desired, the heating element 74 may then be activated to pre-bake the fluid, in the event the fluid is a photoresist, or the wafer 12 may be removed from the mandrel 14 for further processing as desired.

The apparatus and method of the present invention provide for simultaneous application of a semiconductor processing fluid, such as a photoresist primer or photoresist or other material to both sides of a wafer in situ and without removal or other spatial manipulation of the wafer 12. lighly uniform coatings of semiconductor processing fluids may be established simultaneously on both sides of a given wafer, resulting in better yields and much higher manufacturing efficiency. Problems associated with inadvertent dripping of fluid from the containers is eliminated since any unwanted fluid dripping from the containers 26 and 28 will simply fall vertically and not impact the vertically disposed wafer 12. Precise vertical orientation is not required.

Figure 9:
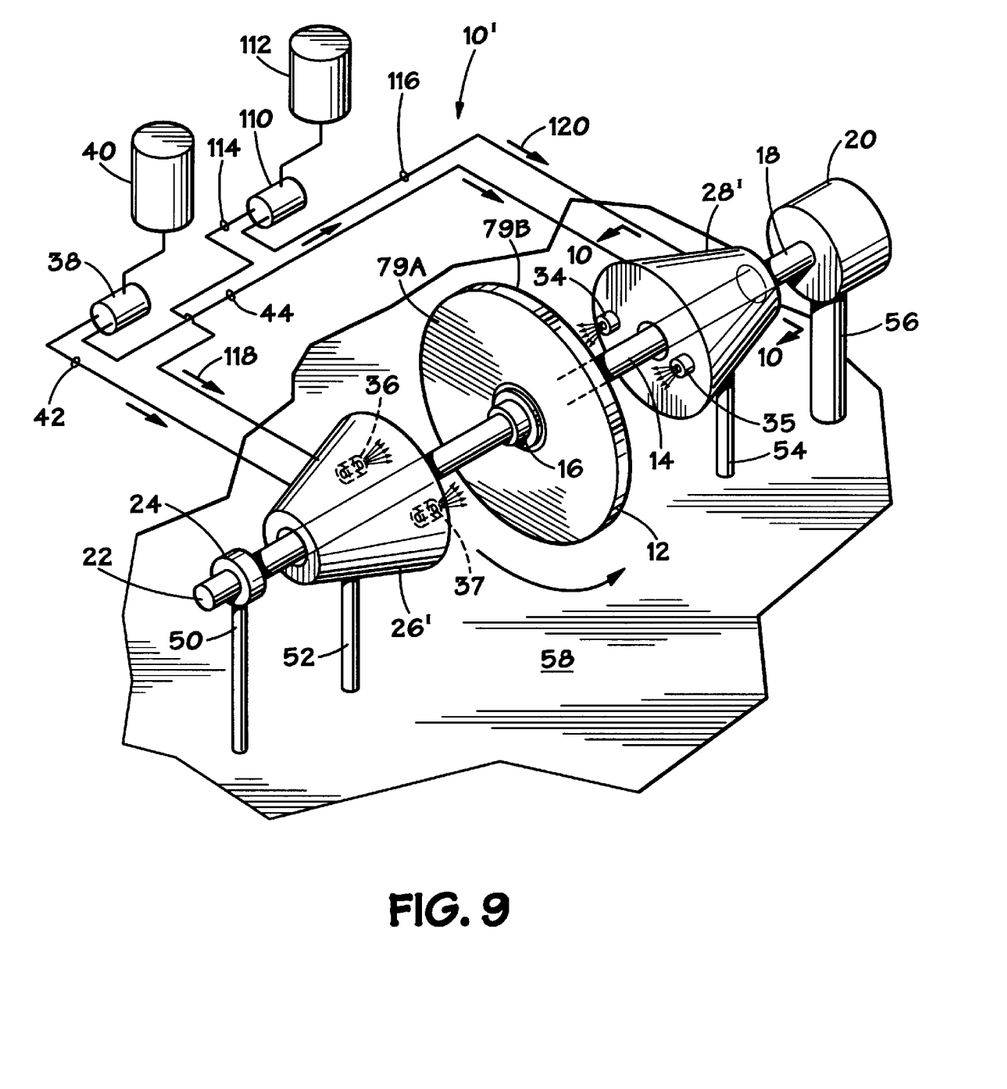
FIG. 9 is a pictorial view of another exemplary embodiment of an apparatus for dispensing fluid on a semiconductor wafer in accordance with the present invention.
Figure 10:
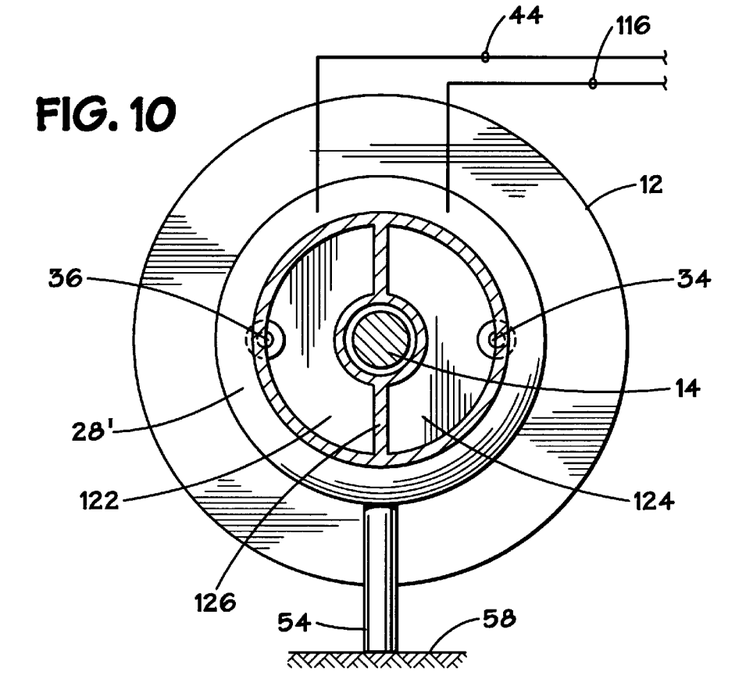
FIG. 10 is a cross-sectional view of FIG. 9 taken at section 10—10.

FIGS. 9 and 10 depict an alternate embodiment of the apparatus for depositing a semiconductor processing fluid, now designated 10'. FIG. 9 is a pictorial view of the apparatus 10', and for simplicity of illustration, the structures for providing longitudinal movement of the containers, now designated 26' and 28', have been omitted from FIG. 9. FIG. 10 is a cross sectional view of FIG. 9 taken at section 10—10. As in the embodiment depicted in FIG. 1, the main reservoir 40, the pump 38, and the supply lines 42 and 44 are provided to deliver a semiconductor processing fluid under pressure to the containers 26' and 28'. However, in this embodiment, a second semiconductor processing fluid is delivered to the containers 26' and 28' via a pump 110 drawing the second semiconductor processing fluid from a reservoir 112 and delivering that second fluid to the containers 26' and 28' via supply lines 114 and 116. The flow directions for the supply lines 42 and 44 are indicated by the arrows 46 and 48. Similarly, the flow directions for the supply lines 114 and 116 are indicated by the arrows 118 and 120. As shown in FIG. 10, the container 28' includes two internal chambers 122 and 124 separated by a centrally disposed bulkhead 126. The chamber 122 is coupled to the supply line 44 and is designed to deliver the first semiconductor processing fluid through the orifice 35 while the second chamber 124 is coupled to the supply line 116 and designed to deliver the second semiconductor fluid through the orifice 34.

This embodiment provides the capability to deposit two different types of semiconductor processing fluids onto both sides 79A and 79b of the wafer 12 without having to move, flip, or otherwise change the position of the wafer 12. For example, the wafer 12 may be positioned on the mandrel 14 and secured to the coupling 16 as generally described above with respect to any of the aforementioned embodiments. Next, the containers 26' and 28' may be moved longitudinally until the orifices 34, 35, 36, and 37 are located very close to the opposite sides 79A and 79B of the wafer 12. At this point, the first semiconductor fluid may be pumped into the chamber 122 and dispensed through the orifice 35 and the complementary orifice 37 on the container 26' to deposit an initial amount of the first semiconductor fluid onto the opposite sides of the wafer 12. The wafer 12 may then be spun through an appropriate spin cycle, such as the cycle described above, to spread and ultimately dry the first semiconductor processing fluid. The second pump 110 may then be actuated to pump the second semiconductor processing fluid into the chamber 124 and dispense that fluid through the orifice 34 and the complimentary orifice 36 on the container 26' to deposit an initial amount of the second semiconductor processing fluid onto the opposite sides of the wafer 12. The wafer 12 may again be run through the aforementioned spin cycle to disperse and dry the second semiconductor processing fluid. In this way, both sides of the wafer 12 may be simultaneously first coated with a photoresist primer, such as HMDS, and then immediately coated with a second semiconductor processing fluid, such as a photoresist, all without having to remove or otherwise spatially manipulate the wafer 12. The skilled artisan will appreciate that a significant advance in fabrication efficiency may be achieved through the apparatus and method of the present invention.

The concept may be carried further. Moor example, the container 28' may be subdivided into three chambers, the chambers 122 and 124 and a third chamber that is not depicted in FIG. 10 but may be similar in configuration to the chambers 122 and 124 and may be provided with a third orifice. In this way, three different types of semiconductor processing fluids, such as a cleaning solvent, a photoresist primer, and a photoresist may be deposited onto both sides of the wafer 12 in situ and without having to remove or otherwise spatially manipulate the wafer 12.

Figure 11:
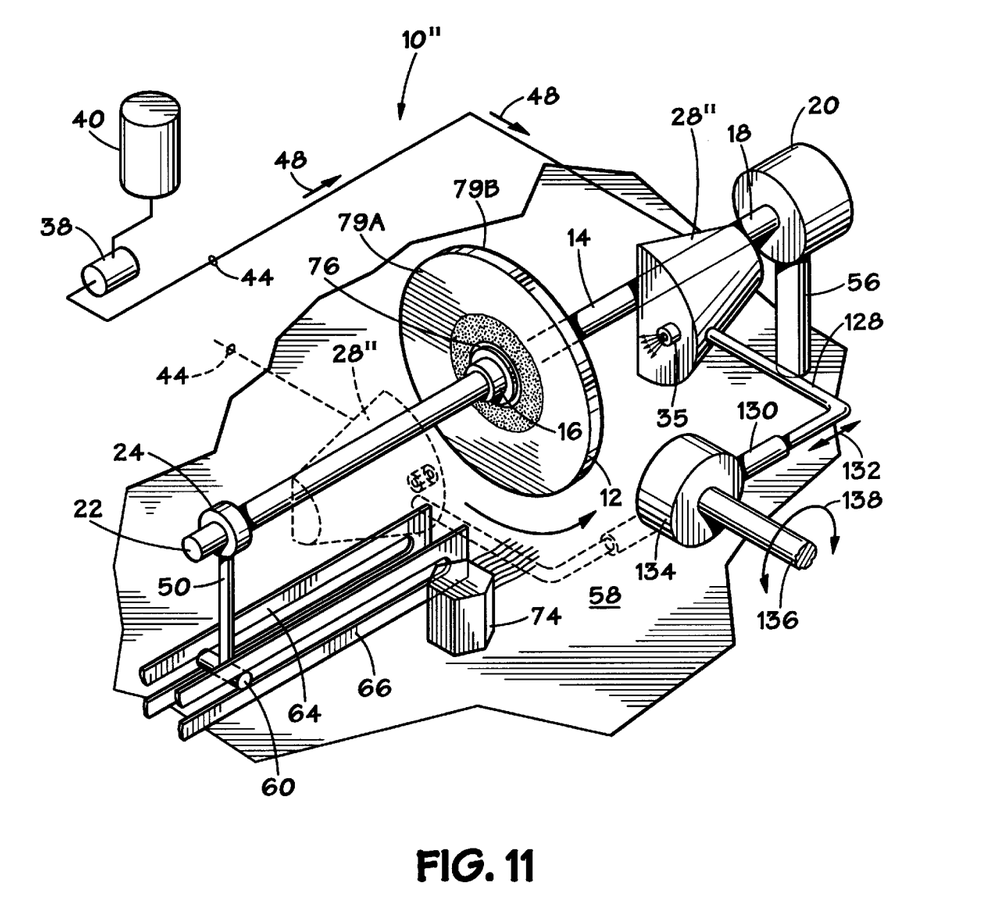
FIG. 11 is a pictorial view of another exemplary embodiment of an apparatus for to dispensing fluid on a semiconductor wafer in accordance with the present invention.

FIG. 11 is a view like FIG. 1, but depicts another alternate embodiment of the apparatus, now designated 10", in accordance with the present invention. In this embodiment, a single container, now designated 28''', is provided. The container 28''' is coupled to an L-shaped member or rod 128 that is, in turn, coupled to a ram 130. The rod is selectively moveable axially as shown by the arrow 132 so that the container 28''' may be positioned proximate the wafer 12 as desired. The ram may be fluid, pneumatic, or servo powered. The ram 130 is coupled to a hub 134 that is, in turn, coupled to a shaft 136 that is rotatable as indicated by the arrow 138. By selectively rotating the shaft 136, the container 28''' may be first positioned proximate the side 79B where fluid may be deposited, then rotated to a position proximate the opposite side 79A (shown in phantom) where fluid may be deposited on the opposite side 79A. In this way opposite sides 79A and 79B of the wafer 12 may be coated with a single container 28''' and without handling the wafer 12.

Figure 12:
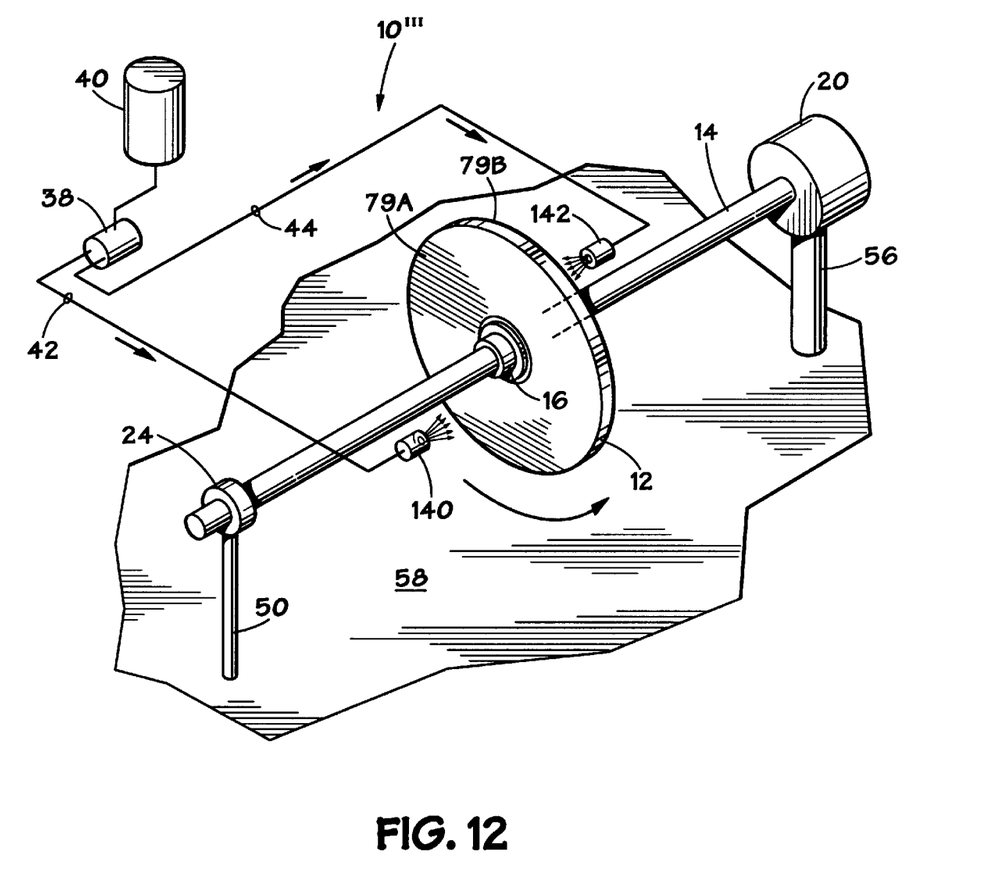
FIG. 12 is a pictorial view of another exemplary embodiment of an apparatus for dispensing fluid on a semiconductor wafer in accordance with the present invention.

FIG. 12 depicts another alternate embodiment of the apparatus, now designated 10'''', in accordance with the present invention. In this embodiment, the containers depicted in the foregoing figures are eliminated in favor of nozzles 140 and 142 respectively coupled to the supply lines 42 and 44. The nozzles 140 and 142 provide the same function as the nozzles in the foregoing embodiments, for example the nozzles 34 and 35 shown in FIG. 1. However, the function of storing the semiconductor processing fluid prior to delivery by the nozzles 140 and 142 is supplied by the main reservoir 40. Fluid drawn from the main reservoir 40 by the pump 38 is delivered directly to the wafer 12 by the nozzles 140 and 142. The supply lines 42 and 44 may serve both as fluid conduits and structural umbilicals to deliver fluid and position and support the nozzles 140 and 142. Alternatively, separate umbilicals may be incorporated to provide structural support and spatial positioning of the nozzles 140 and 142 as desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus for depositing fluids on a semiconductor wafer having first and second sides and a central opening, comprising:
    a mandrel for holding the wafer;
    a motor coupled to the mandrel and being operable to rotate the mandrel;
    a first container for holding a first volume of fluid and having a first orifice for dispensing the first volume of fluid on the first side of the wafer; and
    a second container for holding a second volume of fluid and having a second orifice for dispensing the second volume of fluid on the second side of the wafer.

2. The apparatus of claim 1, wherein the mandrel has a coupling having a first half fixedly coupled to the mandrel and having a first flange for engaging the first side of the semiconductor wafer, and a second half having a second flange for engaging the second side of the semiconductor wafer, the second half being operable to be selectively coupled to the first half whereby the semiconductor wafer is pinched between the first and second halves.

3. The apparatus of claim 2, comprising a first elastomeric member coupled to the first flange to compliantly engage the first side of the semiconductor wafer and a second elastomeric member coupled to the second flange to compliantly engage the second side of the semiconductor wafer.

4. The apparatus of claim 2, wherein the first and second halves are threadedly engageable.

5. The apparatus of claim 2, wherein one of the first and second halves has a radially projecting key and the other of the first and second halves has a slot to receive to the key, whereby rotation of the first half relative to the second half when the key is positioned in the slot moves the first half axially relative to the second half to pinch the semiconductor wafer.

6. The apparatus of claim 2, wherein the first and second halves are magnetically coupled.

7. The apparatus of claim 6, wherein one of the first and second halves has a first magnet and the other of the first and second halves is composed of a magnetically attractable material.

8. The apparatus of claim of claim 6, wherein the first half has a first magnet and the second half has a second magnet.

9. The apparatus of claim 2, wherein the second half is slidably positioned on the mandrel after the semiconductor wafer is slipped over the mandrel.

10. The apparatus of claim 1, wherein the first container has a first longitudinal bore through which the mandrel is disposed.

11. The apparatus of claim 10, wherein the second container has a second longitudinal bore through which the mandrel may be disposed.

12. The apparatus of claim 11, wherein the second container is selectively moveable axially whereby the semiconductor wafer may be first slipped over the mandrel and the second container thereafter moved axially proximate the semiconductor wafer.

13. The apparatus of claim 1, comprising a first pump coupled to the first and second containers to pump the first and second volumes of fluid out the first and second orifices.

14. The apparatus of claim 13, comprising a reservoir coupled to the pump to supply the first and second volumes of fluid to the first and second containers.

15. The apparatus of claim 14, wherein the first and second volumes of fluid comprise the same type of fluid.

16. The apparatus of claim 15, wherein the fluid comprises a photoresist.

17. The apparatus of claim 1, comprising a first pump coupled to the first container to pump the first volume of fluid out of the first orifice and a second pump coupled to the second container to pump the second volume of fluid out of the second orifice.

18. The apparatus of claim 17, comprising a first reservoir coupled to the first pump to supply the first volume of fluid and a second reservoir coupled to the second pump to supply the second volume of fluid.

19. The apparatus of claim 18, wherein the first volume of fluid comprises a photoresist primer and the second volume of fluid comprises a photoresist.

20. An apparatus for depositing fluids on a semiconductor wafer having first and second sides and a central opening, comprising:
    a mandrel for holding the semiconductor wafer while leaving the first and second sides thereof substantially unobstructed;
    a motor coupled to the mandrel and being operable to rotate the mandrel; and
    means for dispensing a first volume of fluid on the semiconductor wafer and a second volume of fluid on the semiconductor wafer.

21. The apparatus of claim 20, wherein the means for dispensing comprises a first container for holding the first volume of fluid and having a first orifice for dispensing the first volume of fluid on the first side of the semiconductor wafer, and a second container for holding the second volume of fluid and having a second orifice for dispensing the second volume of fluid on the second side of the semiconductor wafer.

22. The apparatus of claim 21, wherein the first container has a first longitudinal bore through which the mandrel is disposed.

23. The apparatus of claim 22, wherein the second container has a second longitudinal bore through which the mandrel may be disposed.

24. The apparatus of claim 23, wherein the second container is selectively moveable axially whereby the semiconductor wafer may be first slipped over the mandrel and the second container thereafter moved axially proximate the semiconductor wafer.

25. The apparatus of claim 21, comprising a first pump coupled to the first and second containers to pump the first and second volumes of fluid out the first and second orifices.

26. The apparatus of claim 25, comprising a first reservoir coupled to the first pump to supply the first and second volumes of fluid to the first and second containers.

27. The apparatus of claim 26, wherein the first and second volumes of fluid comprise the same type of fluid.

28. The apparatus of claim 26, wherein the fluid comprises a photoresist.

29. The apparatus of claim 21, comprising a first pump coupled to the first container to pump the first volume of fluid out of the first orifice and a second pump coupled to the second container to pump the second volume of fluid out of the second orifice.

30. The apparatus of claim 29, comprising a first reservoir coupled to the first pump to supply the first volume of fluid and a second reservoir coupled to the second pump to supply the second volume of fluid.

31. The apparatus of claim 30, wherein the first volume of fluid comprises a photoresist primer and the second volume of fluid comprises a photoresist.

32. The apparatus of claim 21, wherein the first container has a first chamber for holding the first volume of fluid and having the first orifice for dispensing the first volume of fluid on the first side of the semiconductor wafer, and a second chamber for holding a third volume of fluid and having a third orifice for dispensing the third volume of fluid on the first side of the semiconductor wafer.

33. The apparatus of claim 32, wherein the second container has a third chamber for holding the second volume of fluid and having the second orifice for dispensing the second volume of fluid on the second side of the semiconductor wafer, and a fourth chamber for holding a fourth volume of fluid and having a fourth orifice for dispensing the fourth volume of fluid on the second side of the semiconductor wafer.

34. The apparatus of claim 20, wherein the means for dispensing comprises a container for holding the first volume of fluid and having a first orifice for dispensing the first volume of fluid on the semiconductor wafer, the container being selectively moveable from a position proximate the first side of the semiconductor wafer to a position proximate the second side of the semiconductor wafer.

35. The apparatus of claim 34, comprising a pump coupled to the container to pump the first volume of fluid out of the first orifice.

36. The apparatus of claim 35, wherein the container comprises a first chamber for holding the first volume of fluid and having the first orifice for dispensing the first volume of fluid on the semiconductor wafer, and a second chamber for holding the second volume of fluid and having a second orifice for dispensing the second volume of fluid on the semiconductor wafer, a second pump being coupled to the second chamber to pump the second volume of fluid out of the second orifice.

37. The apparatus of claim 20, wherein the means for dispensing comprises a reservoir for supplying the first and second volumes of fluid, a first nozzle for dispensing the first volume of fluid to the semiconductor wafer, and a pump coupled to the nozzle and the reservoir for pumping the volume of fluid from the reservoir to the first nozzle.

38. The apparatus of claim 37, wherein the first nozzle is selectively moveable from a position proximate the first side of the semiconductor wafer to a position proximate the second side of the semiconductor wafer.

39. The apparatus of claim 37, comprising a second nozzle coupled to the pump for dispensing the second volume of fluid to the semiconductor wafer.

40. An apparatus for depositing fluids on a semiconductor wafer having first and second sides and a central opening, comprising:

a mandrel for holding the wafer;

a motor coupled to the mandrel and being operable to rotate the mandrel;

a first container having a first chamber for holding a first volume of fluid and having a first orifice for dispensing the first volume of fluid on the first side of the wafer, and a second chamber for holding a second volume of fluid and having a second orifice for dispensing the second volume of fluid on the first side of the wafer; and a second container having a third chamber for holding a third volume of fluid and having third orifice for dispensing the third volume of fluid on the second side of the wafer, and a fourth chamber for holding a fourth volume of fluid and having a fourth orifice for dispensing the fourth volume of fluid on the second side of the wafer.

41. The apparatus of claim 40, comprising a first pump coupled to the first and third chambers for pumping the first and third volumes of fluid out of the first and third orifices, and a second pump coupled to the second and fourth chambers for pumping the second and fourth volumes of fluid out of the second and fourth orifices.

42. The apparatus of claim 41, wherein the first and third volumes of fluid comprise a photoresist primer and the second and fourth volumes of fluid comprise a photoresist.

* * * * *